US010593555B2

(12) United States Patent
Gao et al.

(10) Patent No.: US 10,593,555 B2
(45) Date of Patent: Mar. 17, 2020

(54) COMPOSITE SACRIFICIAL GATE WITH ETCH SELECTIVE LAYER

(71) Applicant: GLOBALFOUNDRIES INC., Grand Cayman (KY)

(72) Inventors: Qun Gao, Clifton Park, NY (US); Naved Siddiqui, Latham, NY (US); Ankur Arya, Saratoga Springs, NY (US); John R Sporre, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/925,928

(22) Filed: Mar. 20, 2018

(65) Prior Publication Data
US 2019/0295852 A1    Sep. 26, 2019

(51) Int. Cl.
*H01L 21/311*    (2006.01)
*H01L 29/66*    (2006.01)
*H01L 21/768*    (2006.01)
*H01L 21/033*    (2006.01)
*H01L 21/762*    (2006.01)
*H01L 21/3105*    (2006.01)

(52) U.S. Cl.
CPC .... *H01L 21/31116* (2013.01); *H01L 21/0332* (2013.01); *H01L 21/31055* (2013.01); *H01L 21/31144* (2013.01); *H01L 21/76224* (2013.01); *H01L 21/76865* (2013.01); *H01L 29/66545* (2013.01)

(58) Field of Classification Search
CPC ......... H01L 21/31116; H01L 21/31055; H01L 21/76224; H01L 21/0332; H01L 21/76865; H01L 29/66545; H01L 21/31144
See application file for complete search history.

(56) References Cited

U.S. PATENT DOCUMENTS

| 9,064,932 | B1 | 6/2015 | Pham et al. |
| 9,324,710 | B2 | 4/2016 | Leobandung |
| 9,837,276 | B2 | 12/2017 | Greene et al. |
| 9,911,736 | B1* | 3/2018 | Zang ................... H01L 27/0886 |
| 2017/0148682 | A1 | 5/2017 | Basker et al. |
| 2019/0131428 | A1* | 5/2019 | Huang .............. H01L 29/66545 |

* cited by examiner

*Primary Examiner* — Duy Vu N Deo
(74) *Attorney, Agent, or Firm* — Francois Pagette; Hoffman Warnick LLC

(57) ABSTRACT

The manufacture of a FinFET device includes the formation of a composite sacrificial gate. The composite sacrificial gate includes a sacrificial gate layer such as a layer of amorphous silicon, and an etch selective layer such as a layer of silicon germanium. The etch selective layer, which underlies the sacrificial gate layer, enables the formation of a gate cut opening having a controlled critical dimension that extends through the composite sacrificial gate.

14 Claims, 20 Drawing Sheets

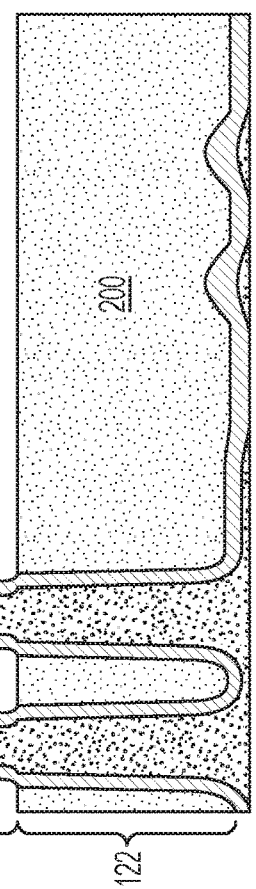
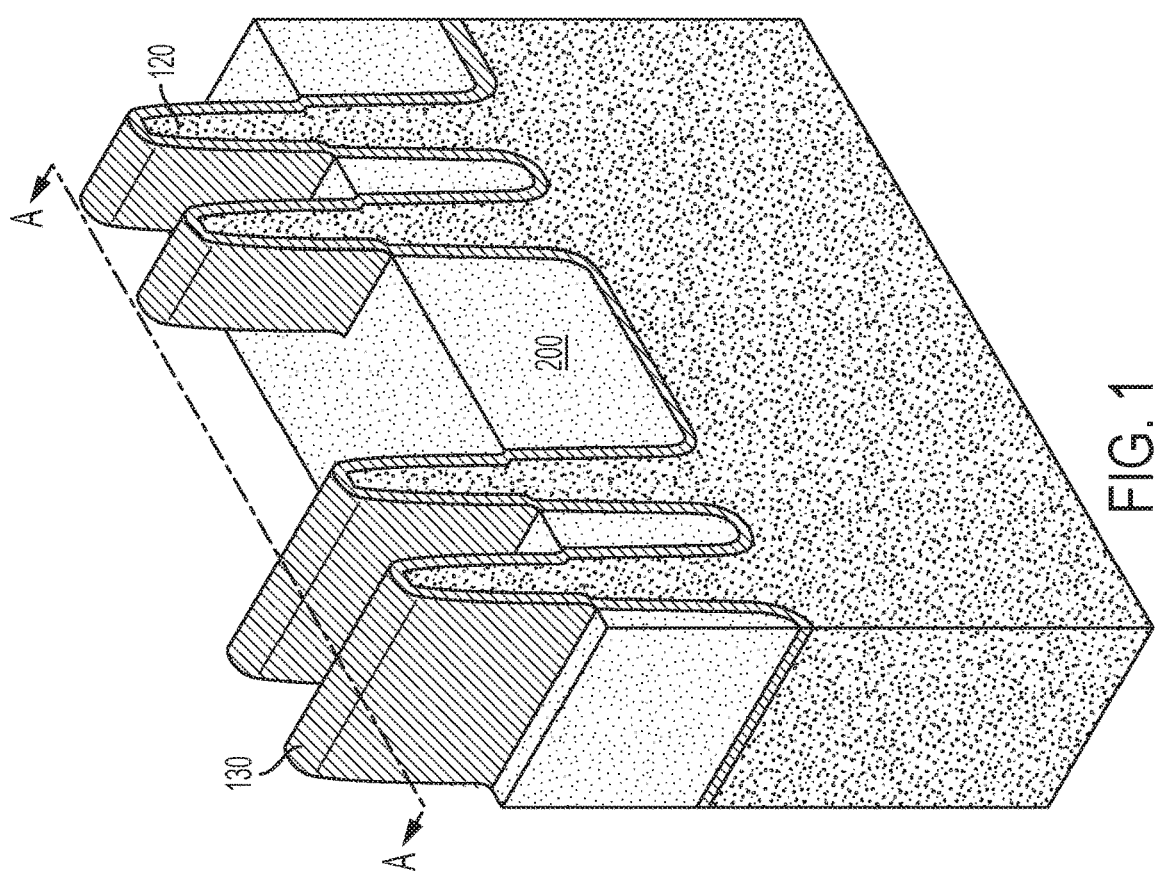

US 10,593,555 B2

COMPOSITE SACRIFICIAL GATE WITH ETCH SELECTIVE LAYER

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is replaced by a functional gate after device activation, i.e., after dopant implantation into source/drain regions of the fins and an associated drive-in anneal, in order to avoid exposing the functional gate materials to the thermal budget associated with activation.

A "functional gate" refers to a structure used to control output current (i.e., the flow of carriers through a channel) of a semiconductor device using an electrical field or, in some instances, a magnetic field. A functional gate typically includes one or more gate dielectric layers and one or more gate conductor layers.

Prior to removing the sacrificial gate and forming a functional gate, a gate cut module may be used to sever (i.e., segment) the sacrificial gate in order to define and isolate adjacent devices. In association with such a process, portions of the sacrificial gate are removed to form openings that are backfilled with an etch selective dielectric material, i.e., isolation layer, that provides a barrier between adjacent functional gates following removal and replacement of the remaining sacrificial gate material.

At advanced nodes, however, notwithstanding recent developments, it remains a challenge to define a gate cut opening with both the desired critical dimensions and alignment precision amidst a plurality of densely-arrayed fins. For instance, the formation of a gate cut opening typically involves the competing objectives of thoroughly removing sacrificial gate material from within the opening, while not compromising a critical dimension of the opening due to excessive etching.

Notably, an insufficient etch and the incomplete removal of the sacrificial gate material, especially at the bottom of the gate cut opening, may result in a short circuit between later-formed functional gates. On the other hand, an over-etch to ensure complete removal of the sacrificial gate material may increase a critical dimension of the gate cut opening and correspondingly decrease the gap between the isolation layer and an adjacent fin. As the gap between the isolation layer and an adjacent fin decreases, it is increasingly challenging to remove material such as an extended gate oxide from the fin without leaving unwanted residue. It is also a processing challenge to deposit a complete functional gate into an overly narrow gap.

SUMMARY

Accordingly, it would be beneficial to provide a method for defining and partitioning a sacrificial gate at critical dimensions with a high degree of accuracy and precision, especially a method where forming a gate cut opening allows for the complete removal of sacrificial gate material from within the opening at advanced nodes without altering design rules or otherwise compromising critical dimension (CD) fidelity.

According to various embodiments, the sacrificial gate is formed as a composite sacrificial gate, which includes a sacrificial gate layer and an etch selective layer. The sacrificial gate layer is disposed over the etch selective layer. During formation of a gate cut opening through the composite sacrificial gate, a relatively aggressive but selective etch chemistry may be used to remove substantially all of the sacrificial gate material, including the etch selective layer, from the bottom of the gate cut opening without adversely increasing a lateral dimension (i.e., critical dimension) of the gate cut opening. Moreover, in certain embodiments, after backfilling the gate cut opening with an isolation dielectric, a distance between the isolation dielectric and an adjacent fin is sufficiently large to enable both effective removal of an extended gate oxide layer from over the adjacent fin, and deposition of a complete functional gate stack over the fin and within the gap.

A method of forming a structure includes forming a composite sacrificial gate over a plurality of semiconductor fins, wherein forming the composite sacrificial gate includes forming an etch selective layer over the fins and forming a sacrificial gate layer over the etch selective layer, forming a gate cut opening that extends through the composite sacrificial gate, wherein the gate cut opening is laterally spaced away from each of a pair of the fins; and forming an isolation layer within the gate cut opening.

A further method of forming a structure includes forming an etch selective layer over a plurality of semiconductor fins and extending between the fins, forming a sacrificial gate layer over the etch selective layer, forming a gate cut opening that extends through the sacrificial gate layer and the etch selective layer, wherein the gate cut opening is laterally spaced away from the fins, and forming an isolation layer within the gate cut opening.

Also disclosed is a semiconductor structure. The structure includes a fin disposed over a semiconductor substrate and a functional gate disposed over the fin, where the functional gate comprises a gate dielectric formed over the fin and a gate conductor formed over the gate dielectric. An isolation layer is laterally spaced from the fin and contacts the functional gate, wherein the isolation layer has a first width in an upper portion thereof and a second width greater than the first width in a lower portion thereof.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIGS. 1 and 1A are perspective and cross-sectional views, respectively, of a device structure showing the formation of a plurality of fins over a semiconductor substrate, a shallow trench isolation layer over the substrate and between the fins, and an extended gate oxide over the fins;

DETAILED DESCRIPTION

Figure 2A:
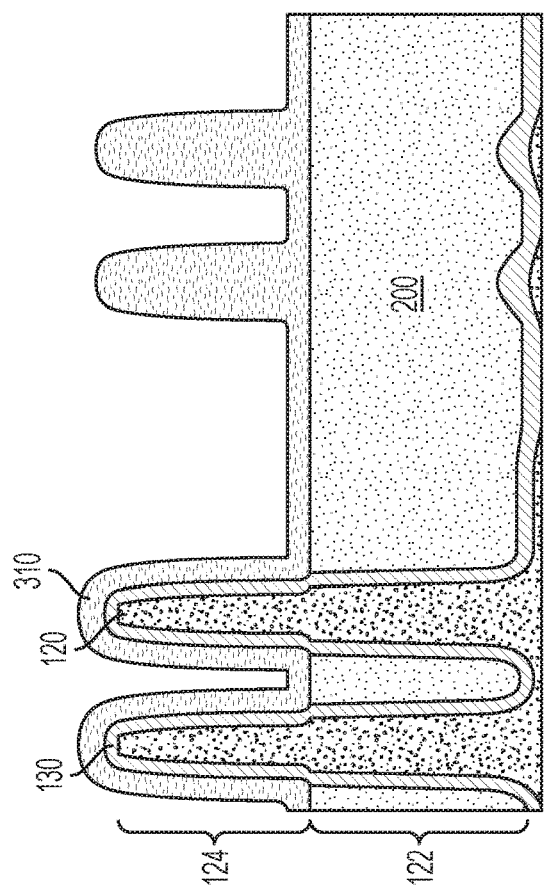
FIGS. 2 and 2A show the deposition of an etch selective layer over the fins.

Reference will now be made in greater detail to various embodiments of the subject matter of the present application, some embodiments of which are illustrated in the accompanying drawings. The same reference numerals will be used throughout the drawings to refer to the same or similar parts.

Disclosed are FinFET device structures and methods of manufacturing FinFET devices, and more particularly methods that leverage a composite sacrificial gate that includes an etch selective layer. The incorporation of the etch selective layer enables a wide process window for the formation of a gate cut opening through the sacrificial gate. Various embodiments related to the formation of FinFET structures using a composite sacrificial gate in conjunction with a replacement metal gate process are described herein with reference to FIGS. 1-11.

A simplified perspective schematic diagram of a FinFET architecture at an intermediate stage of fabrication is shown in FIG. 1, where plural semiconductor fins 120 are arrayed over a semiconductor substrate 100. In FIG. 1, reference line A is oriented perpendicular to a length dimension of the fins 120. A corresponding cross-sectional view of the FIG. 1 architecture along reference line A is shown in FIG. 1A.

The exemplary structure includes a semiconductor substrate 100 and a plurality of semiconductor fins 120 disposed over the substrate 100. The semiconductor fins 120 are arranged in parallel and are laterally isolated from each other within a sub-fin region 122 by a shallow trench isolation layer 200. The fins 120 extend above a top surface of the shallow trench isolation layer (STI) layer 200 and define an active device region 124. A conformal extended gate (EG) oxide layer 130 is formed over the fins 120.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C) amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including II-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer.

Substrate 100 may have dimensions as typically used in the art and may be, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may include (100)-oriented silicon or (111)-oriented silicon, for example.

In various embodiments, fins 120 include a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In certain embodiments, the fins 120 can have a width of 5 nm to 20 nm and a height of 40 nm to 150 nm, although other dimensions are also contemplated. Fins 120 may be arrayed on the substrate at a regular intrafin spacing or pitch (d). As used herein, the term "pitch" refers to the sum of the fin width and the spacing between a pair of adjacent fins. In example embodiments, the fin pitch may be within a range of 20 to 100 nm, e.g., 20, 30, 40, 50, 60, 70, 80, 90 or 100 nm, including ranges between any of the foregoing values, although smaller and larger pitch values may be used.

As seen in the various cross-sectional views, a shallow trench isolation (STI) layer 200 may be used to provide electrical isolation between the fins 120 and between adjacent devices as is needed for the circuit(s) being formed. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric fill material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is then etched back to form a recessed, uniformly thick oxide isolation layer 200 between the fins 120, where upper sidewalls of the fins 120, i.e., sidewalls within active device region 124, can be exposed for further processing.

As shown in the illustrated embodiment, the fins 120 may be conformally coated with extended gate (EG) oxide layer 130. The EG oxide layer 130 may include silicon dioxide, for example, and may be formed over the fins within the sub-fin and active device region 122, 124. The EG oxide layer 130 may have a thickness of 2 to 3 nm, for example. During the course of manufacturing the FinFET device, the EG oxide 130 may be stripped from source and drain regions of the fins and/or channel regions of the fins.

Figure 2:
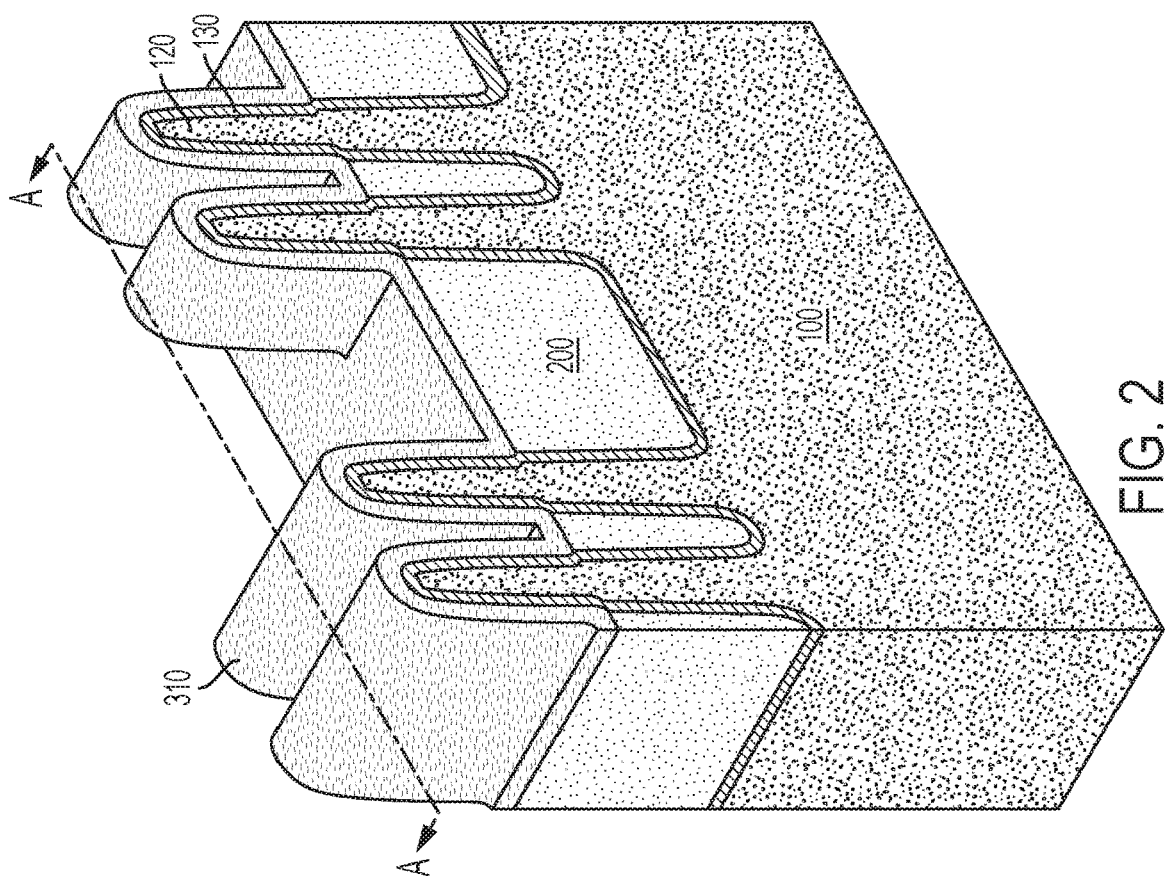

Referring to FIG. 2 and FIG. 2A, an etch selective sacrificial gate layer 310 (hereinafter "etch selective layer") is formed over the fins 120 and over the shallow trench isolation layer 200 between the fins. In particular embodiments, the etch selective layer 130 is configured to be etched selectively with respect to a later-formed sacrificial gate layer, which is deposited over the etch selective layer 130.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

The etch selective layer 310 may include doped silicon (e.g., silicon doped with boron or phosphorus) or silicon germanium (SiGe), for example, and may have a thickness of 4 to 10 nm, e.g., 4, 6, 8 or 10 nm, including ranges between any of the foregoing values. Suitable processes to form the etch selective layer 310 include chemical vapor deposition (CVD) and atomic layer deposition (ALD).

An example deposition process to form a silicon germanium etch selective layer 310 uses a gas mixture containing a silicon source, a germanium source, and a carrier gas. The gases are flowed concurrently into a deposition chamber containing a substrate at a deposition (e.g., substrate) temperature of 450-800° C. and a growth pressure (i.e., chamber pressure) of 0.1-700 Torr. Example silicon source gases include silane ($SiH_4$) and dichlorosilane ($SiH_2Cl_2$). Example germanium source gases include germane ($GeH_4$). The carrier gas can include $H_2$ and/or $N_2$.

In an example process, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used.

By way of example, doped etch selective layers contain a sufficient amount of dopant to enable such a doped layer to be etched selectively with respect to the sacrificial gate layer. By way of further example, the germanium content of a silicon germanium ($SiGe_x$) etch selective layer 310 may be in the range of 25 to 50 atomic percent.

Figure 3:
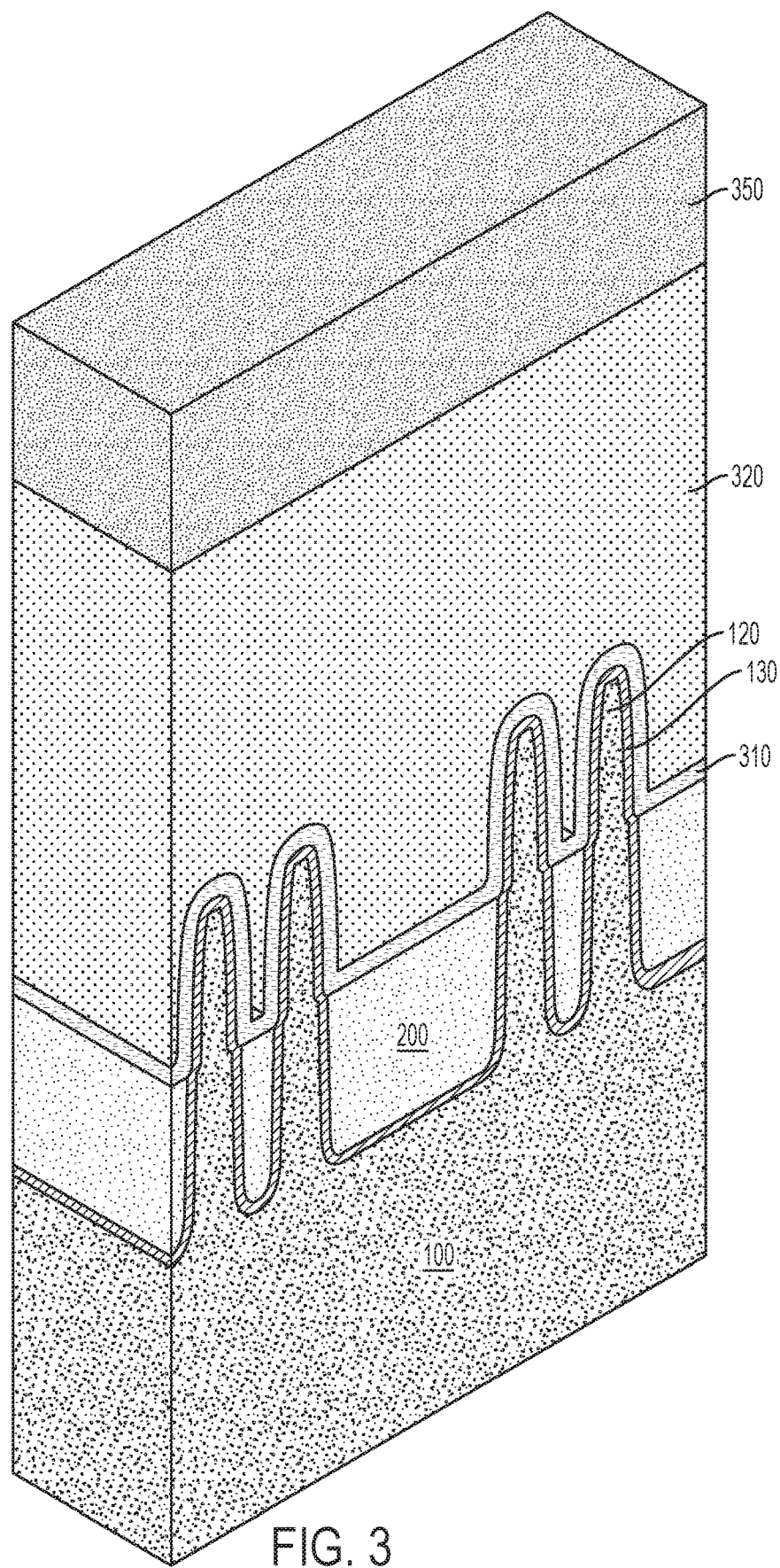
FIGS. 3 and 3A depict the formation of a sacrificial gate layer over the etch selective layer and a sacrificial gate hard mask over the sacrificial gate layer.
Figure 3A:
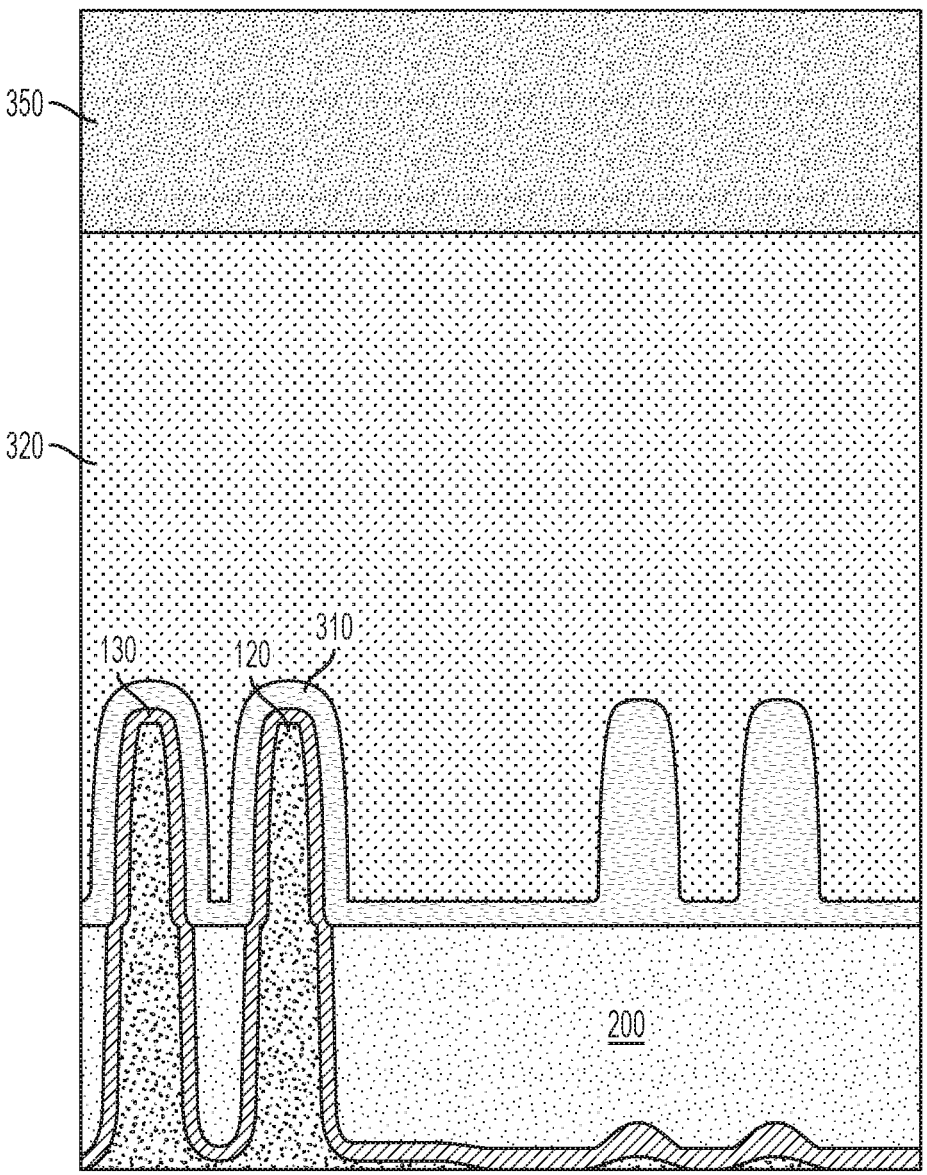

Referring to FIG. 3 and FIG. 3A, a sacrificial gate layer 320 is deposited over the etch selective layer 310 and over the STI layer 200. The sacrificial gate layer 320 may include a blanket layer of polycrystalline silicon or amorphous silicon (a-Si). Amorphous elemental silicon, for example, can be deposited using chemical vapor deposition, such as low pressure chemical vapor deposition (LPCVD) at temperatures ranging from 450° C. to 700° C. Silane ($SiH_4$) can be used as the precursor for CVD silicon deposition. A thickness of sacrificial gate layer 320 may range from 50 to 200 nm, e.g., 50, 75, 100, 125, 150, 175 or 200 nm, including ranges between any of the foregoing values, although lesser and greater thicknesses may be used. A CMP process may be used to planarize a top surface of the sacrificial gate layer 320.

"Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Optionally, a sacrificial oxide layer (not shown) may be deposited over the sacrificial gate layer 320 prior to a CMP step and then subsequently removed during the CMP step in order to enhance planarization. During the planarization step, the sacrificial gate layer 320 may serve as a CMP etch stop. In certain embodiments, a non-selective etch such as a reactive ion etch (RIE) of the post-planarized sacrificial gate layer 320 may be used to define the thickness of the sacrificial gate layer 320.

According to certain embodiments, the etch selective layer 310 may include doped silicon (e.g., silicon doped with boron or phosphorus) or silicon germanium, while the sacrificial gate layer 320 may include polycrystalline silicon or amorphous silicon (a-Si).

According to further embodiments, the etch selective layer 310 may include polycrystalline silicon or amorphous silicon (a-Si), while the sacrificial gate layer 320 may include doped silicon (e.g., silicon doped with boron or phosphorus) or silicon germanium.

As will be described in further detail below, the etch selective layer 310 and the sacrificial gate layer 320 are adapted to be patterned and provide a structure for a replacement metal gate (RMG) module used to define a three-dimensional gate architecture over the fins 120. Although only two pairs of fins 120 are shown, depending on the design requirements for the associated device(s), the number of fins may vary from 2 to 100, although a greater number of fins may be used.

Figure 4:
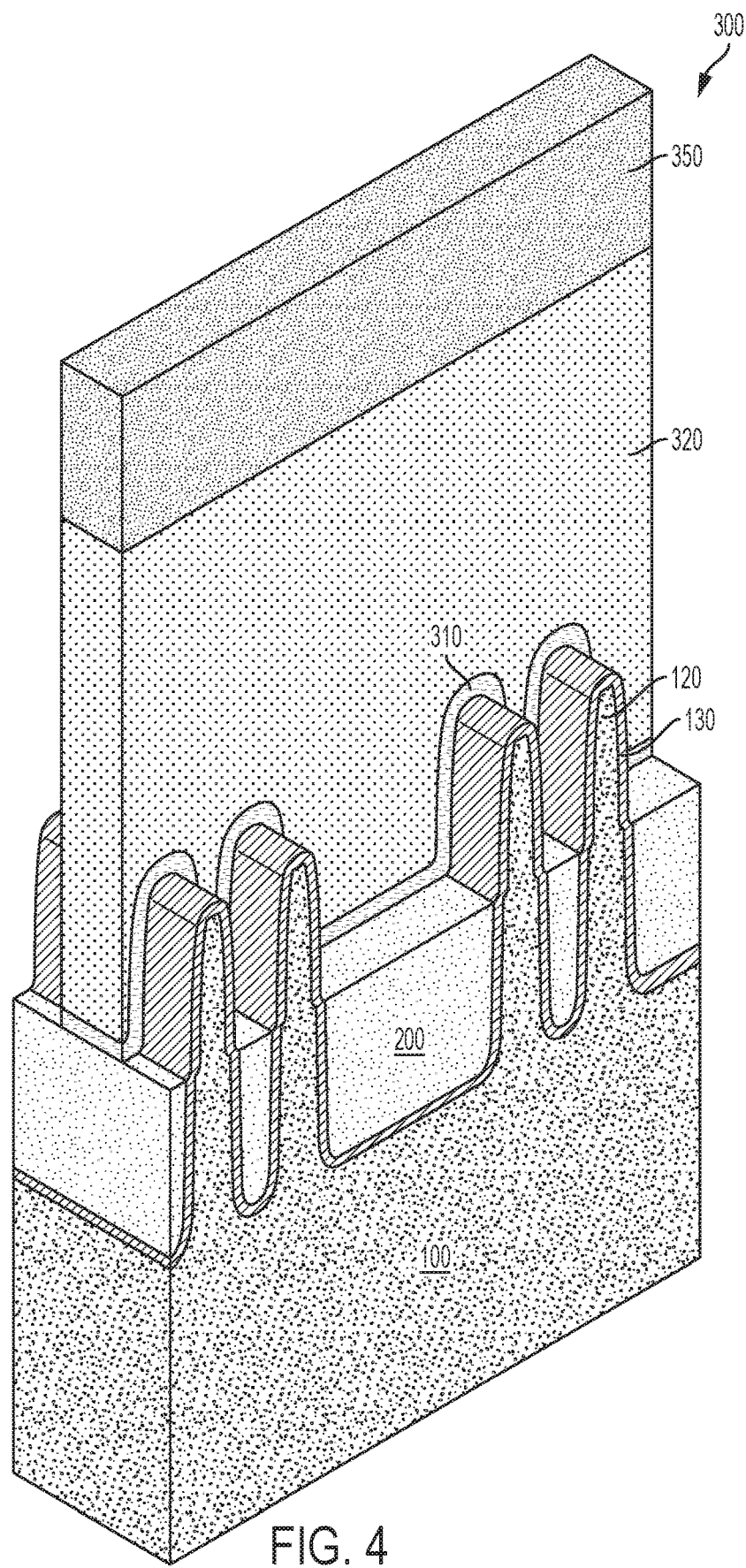
FIGS. 4 and 4A show etching of the sacrificial gate layer and the etch selective layer to define a composite sacrificial gate overlying channel regions of the fins.
Figure 4A:
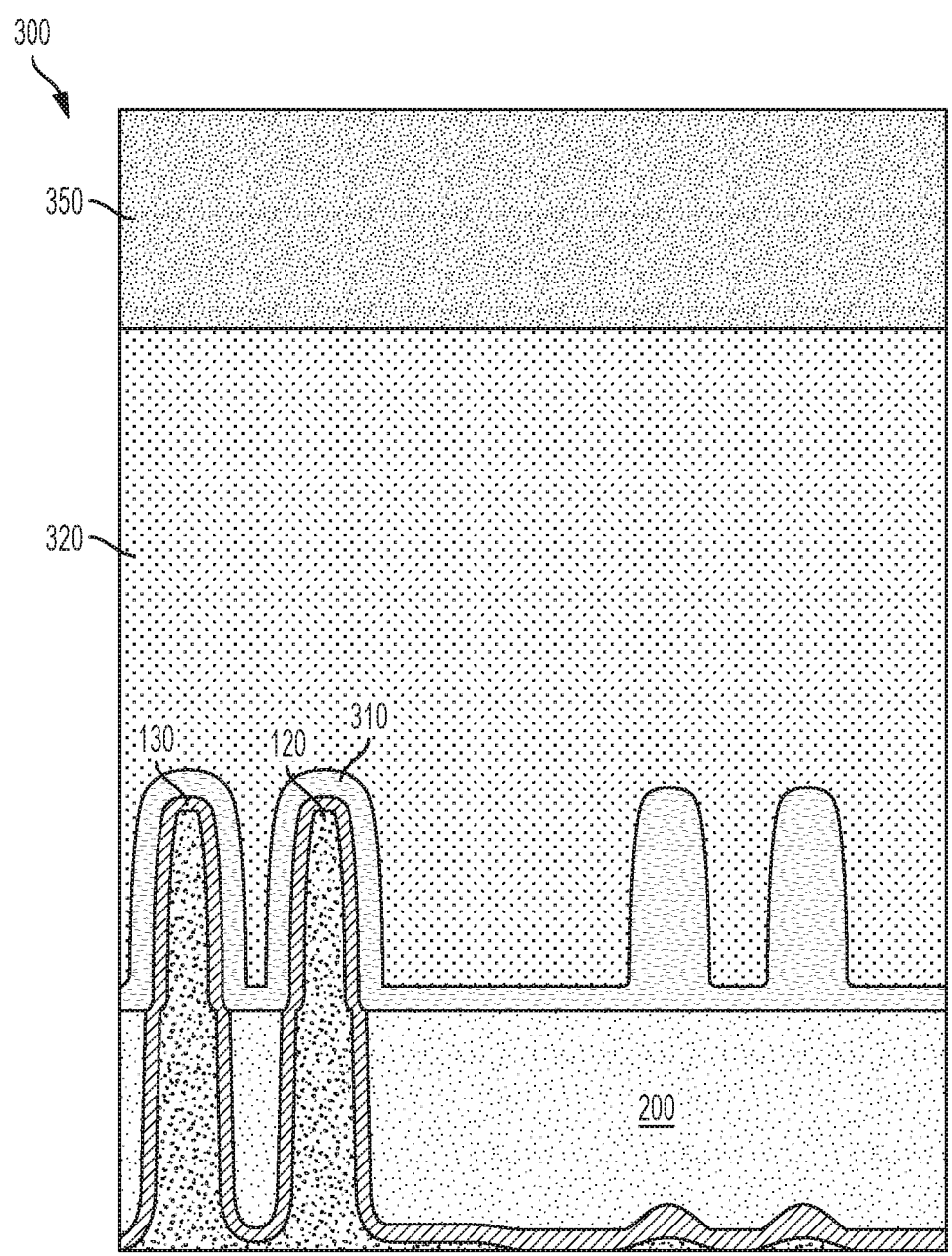

A hardmask 350 is formed over the planarized structure and conventional photolithography and etching techniques, e.g., using hardmask 350 as an etch mask, are used to pattern and etch the sacrificial gate layer 320 and the underlying etch selective layer 310 to form a composite sacrificial gate 300, as shown in FIG. 4. A directional etching process such as, for example, reactive ion etching (RIE) can be used to define one or more composite sacrificial gates 300. The composite sacrificial gate 300 straddles the fins 120 and includes both the sacrificial gate layer 320 and the underlying etch selective layer 310. A cross-sectional view corresponding to the perspective view of FIG. 4 taken through composite sacrificial gate 300 is shown in FIG. 4A.

Figure 5:
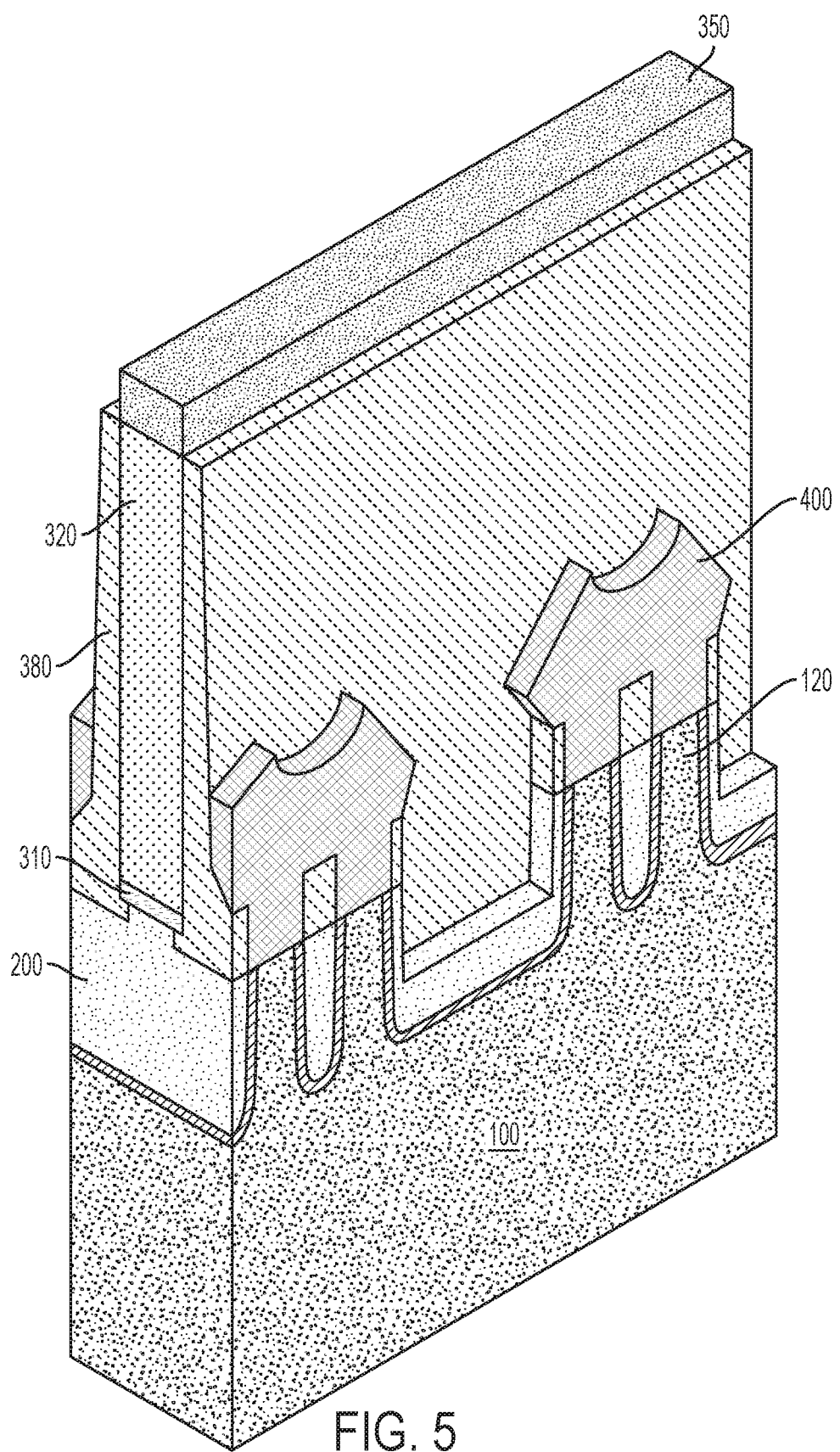
FIGS. 5 and 5A show the deposition of a spacer layer over sidewalls of the composite sacrificial gate and the formation of source/drain junctions over source/drain regions of the fins.
Figure 5A:
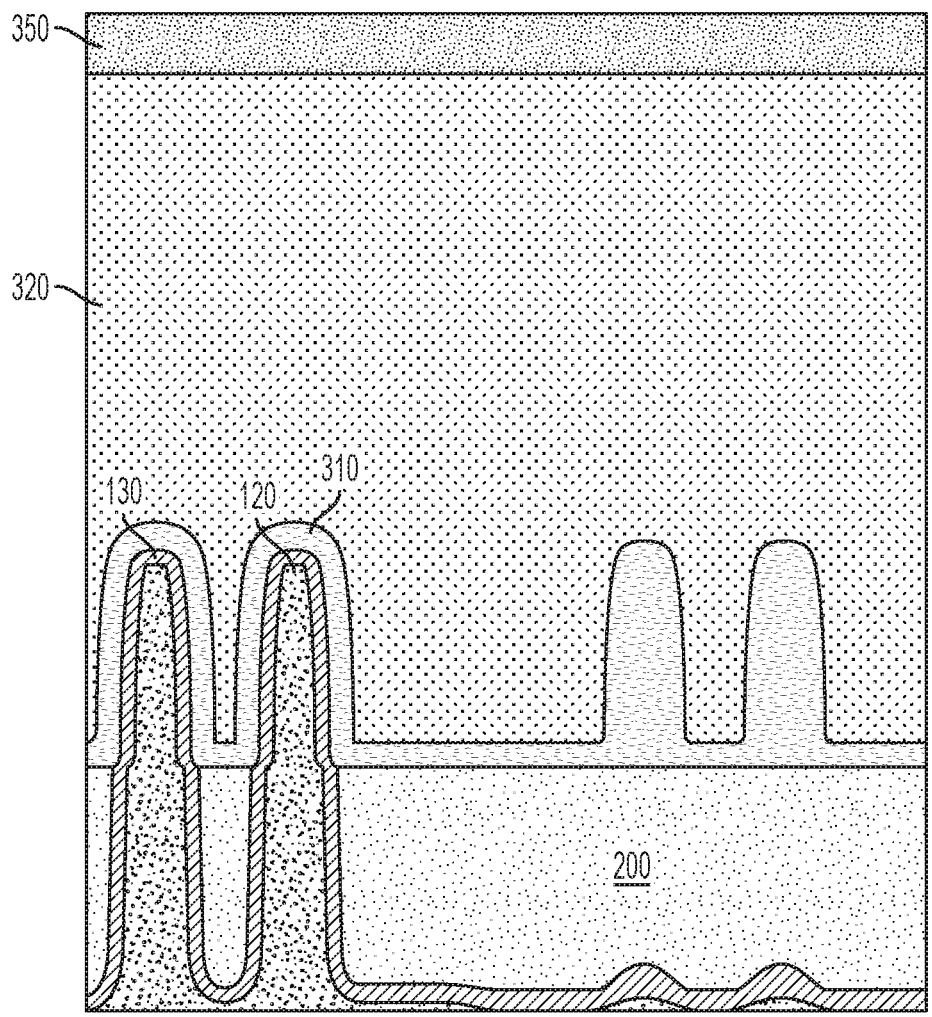

Referring to FIG. 5 and FIG. 5A, sidewall spacers 380 are formed over sidewalls (vertical surfaces) of the composite sacrificial gate 300. Sidewall spacers 380 may be formed by blanket deposition of a spacer material (e.g., using atomic layer deposition) followed by a directional etch such as reactive ion etching (RIE) to remove the spacer material from horizontal surfaces. In certain embodiments, the sidewall spacer 380 thickness is 4 to 20 nm, e.g., 4, 8, 10, 15 or 20 nm, including ranges between any of the foregoing values.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

Suitable materials for sidewall spacers 380 include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material.

As used herein, the compounds silicon dioxide and silicon nitride have compositions that are nominally represented as $SiO_2$ and $Si_3N_4$, respectively. The terms silicon dioxide and silicon nitride, refer to not only these stoichiometric compositions, but also to oxide and nitride compositions that deviate from the stoichiometric compositions.

Referring still to FIG. 5, following formation of the sidewall spacers 380, source/drain junctions 400 may be formed over source/drain regions of the fins by ion implantation or selective epitaxy, e.g., using the sidewall spacers 380 as an alignment mask. According to various embodiments, source/drain junctions 400 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. Example epitaxial growth processes include low energy plasma deposition, liquid phase epitaxy, molecular beam epitaxy, and atmospheric pressure chemical vapor deposition.

The source/drain junctions 400 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 400 may be diffused into the semiconductor fin 120 using a post-epitaxy or post-implantation anneal (e.g., at a temperature of 600° C. to 1400° C.) to create a desired dopant profile within a fin.

Figure 6:
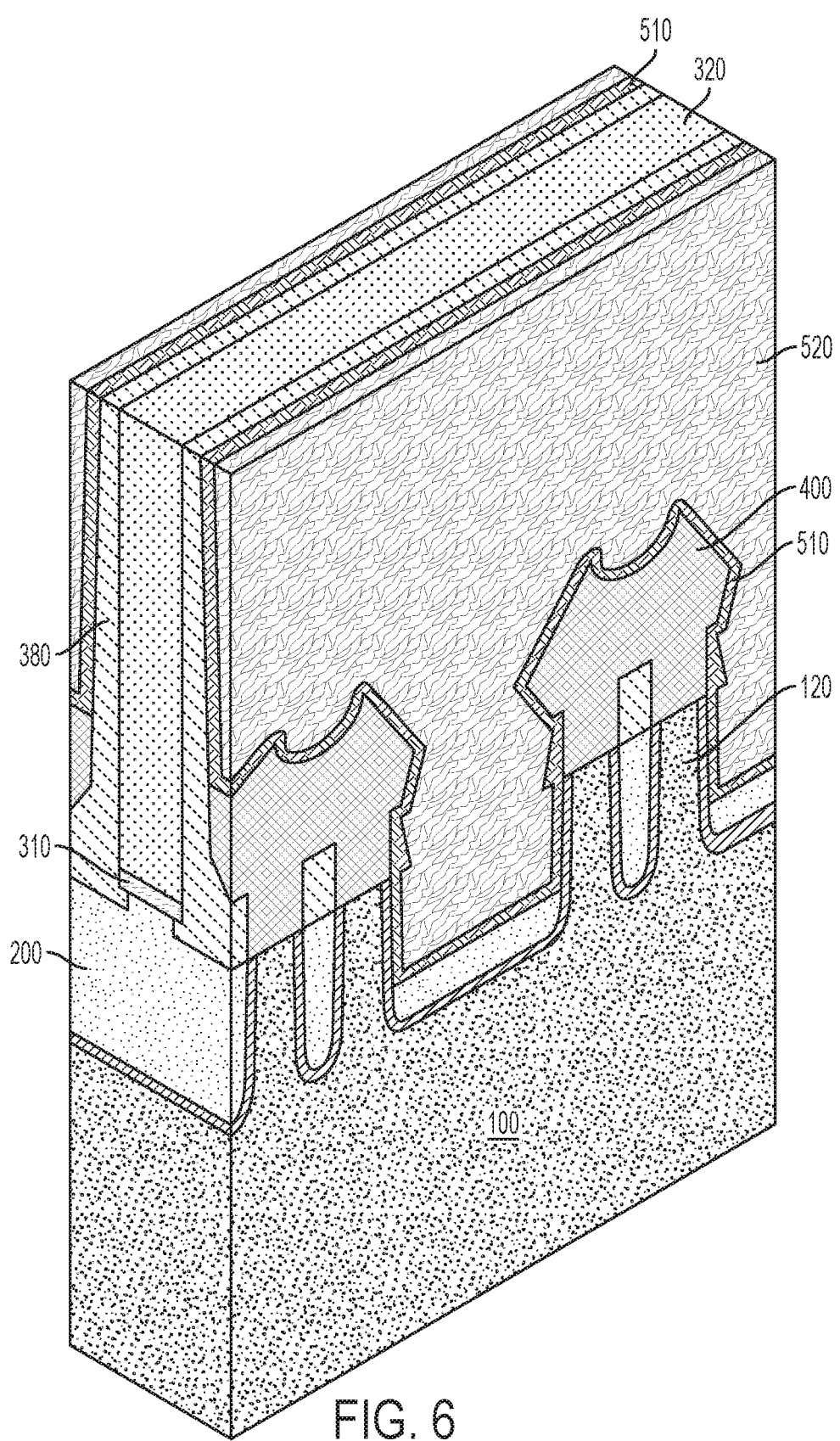
FIGS. 6 and 6A depict the formation and planarization of a contact etch stop layer and interlayer dielectric over source/drain regions of the fins.
Figure 6A:
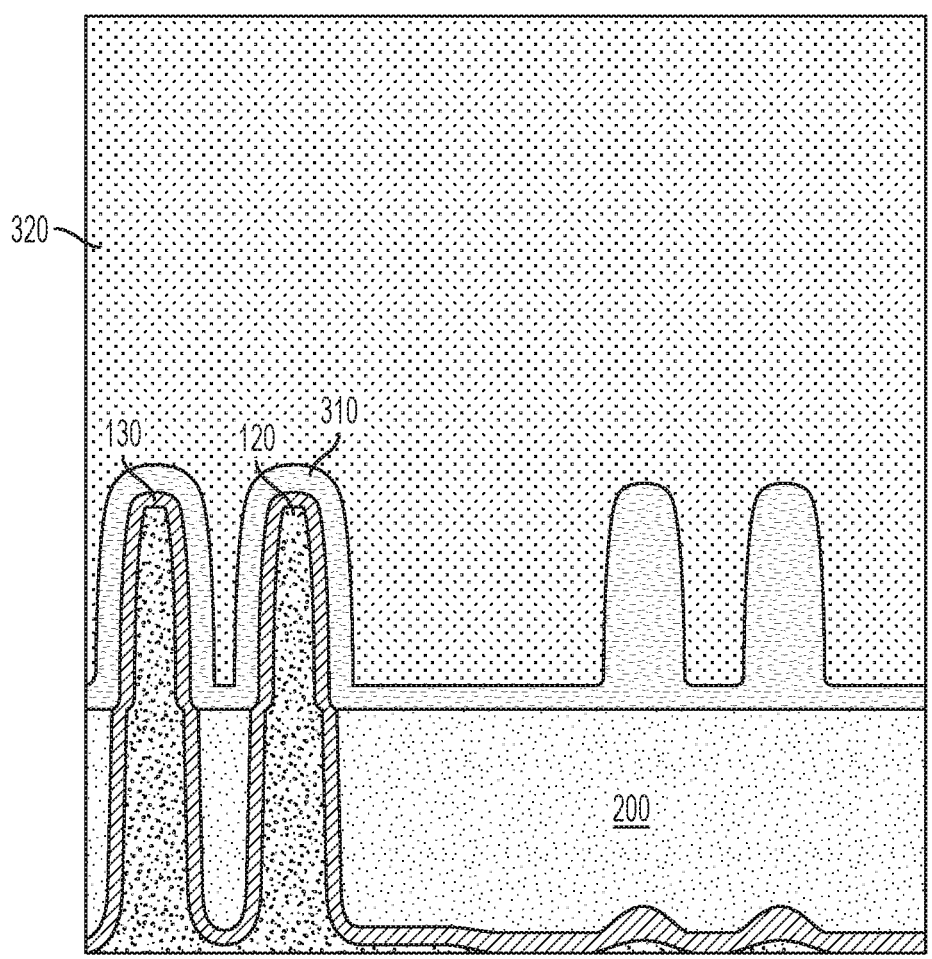

Referring to FIG. 6, a conformal liner 510 and interlayer dielectric (ILD) 520 are successively formed over the source/drain junctions 400 and over sidewall spacers 380 to fill the trench over the source/drain junctions 400, i.e., within contact locations over the source/drain junctions 400, and the resulting structure is then planarized, optionally using remaining portions of the sacrificial gate layer 320 as an etch stop layer. The conformal liner 510 may include silicon nitride, and the ILD 520 may include silicon dioxide. The conformal liner and the ILD may be formed by atomic layer deposition (ILD) or chemical vapor deposition (CVD). FIG. 6A is a cross-sectional view through the sacrificial gate layer 320 of FIG. 6.

Figure 7:
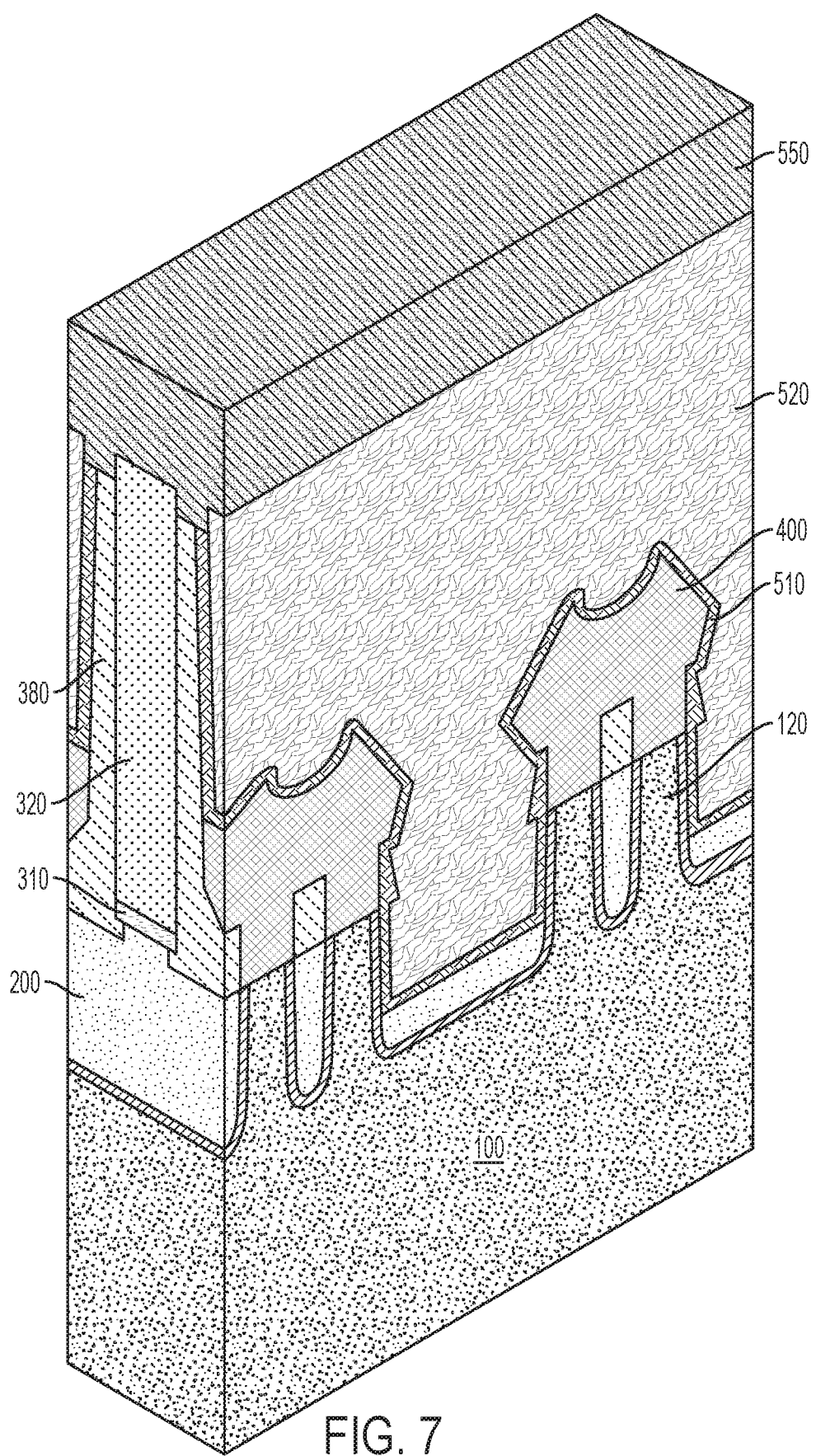
FIGS. 7 and 7A show the formation of a gate cut hard mask over the composite sacrificial gate.
Figure 7A:
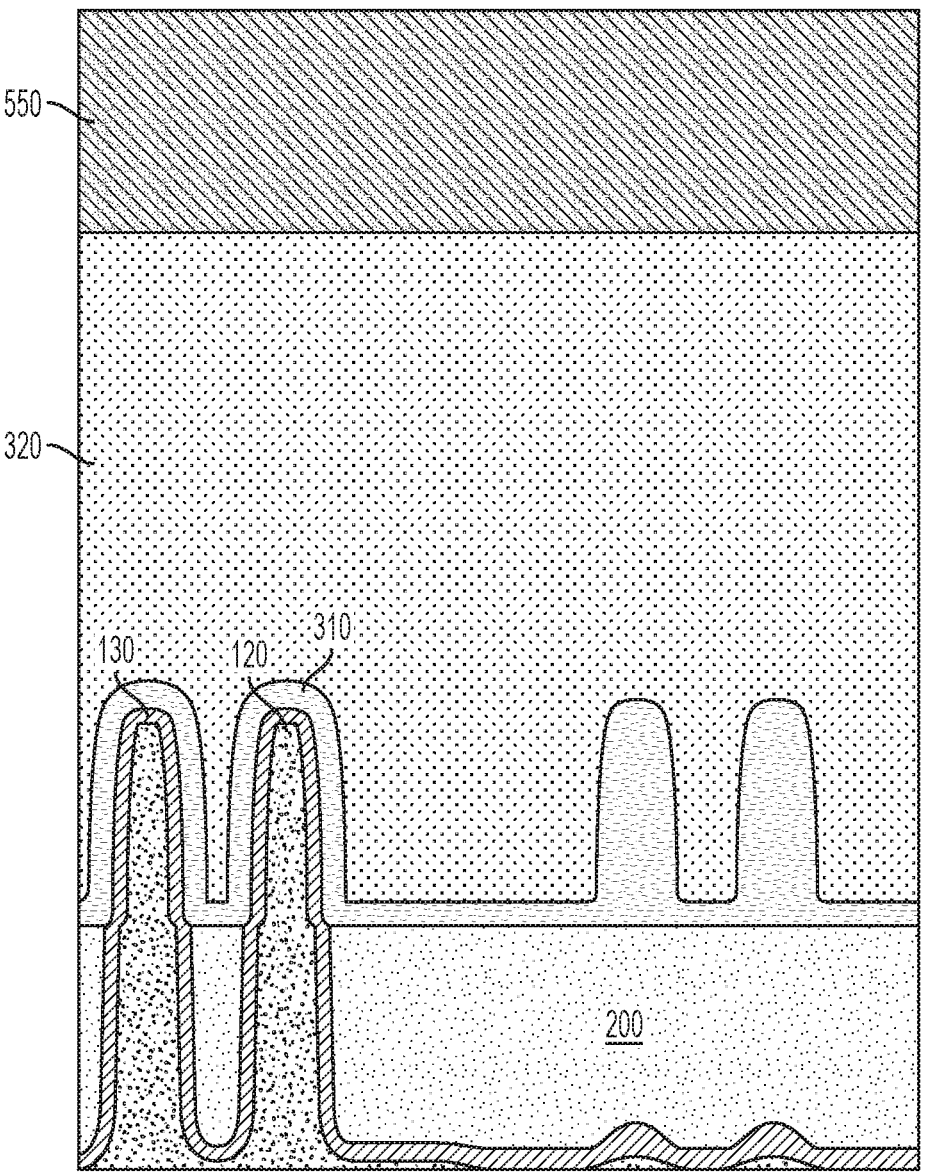

Referring to FIG. 7, a hard mask 550 is formed over the sacrificial gate 300, spacer layer 380, conformal liner 510 and ILD 520. The hardmask 550 may include a layer of silicon nitride, for example. As shown in the illustrated embodiment, prior to forming the hard mask 550, the spacer layer 380 and the conformal liner 510 may be etched selectively with respect to the sacrificial gate layer 320 and the ILD 520 to recess a top surface of each of the spacer layer 380 and the conformal liner 510. FIG. 7A is a cross-sectional view of FIG. 7 taken through the sacrificial gate layer 320.

Figure 8:
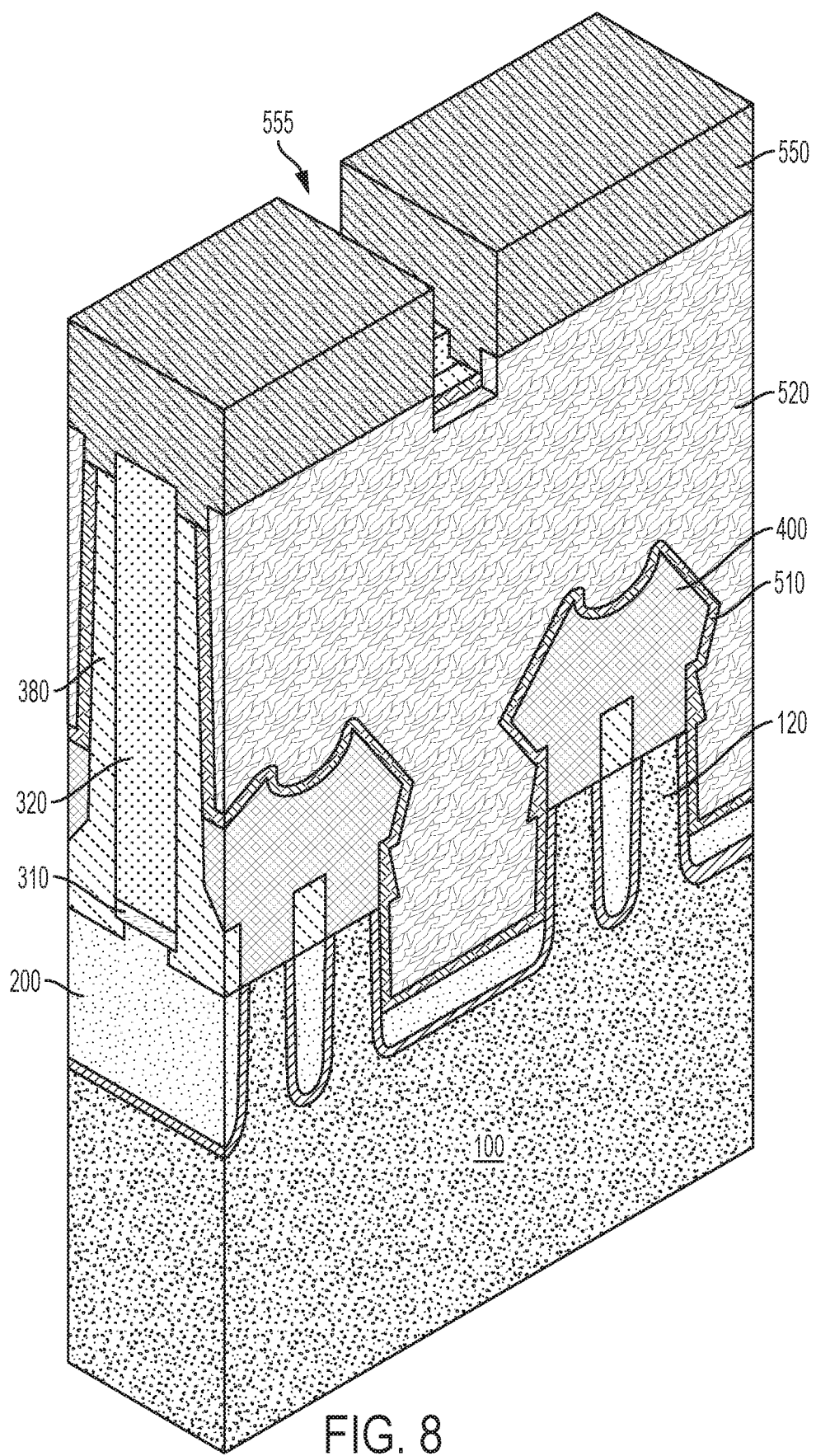
FIGS. 8 and 8A show patterning of the gate cut hard mask and etching of the composite sacrificial gate to form a gate cut opening.
Figure 8A:
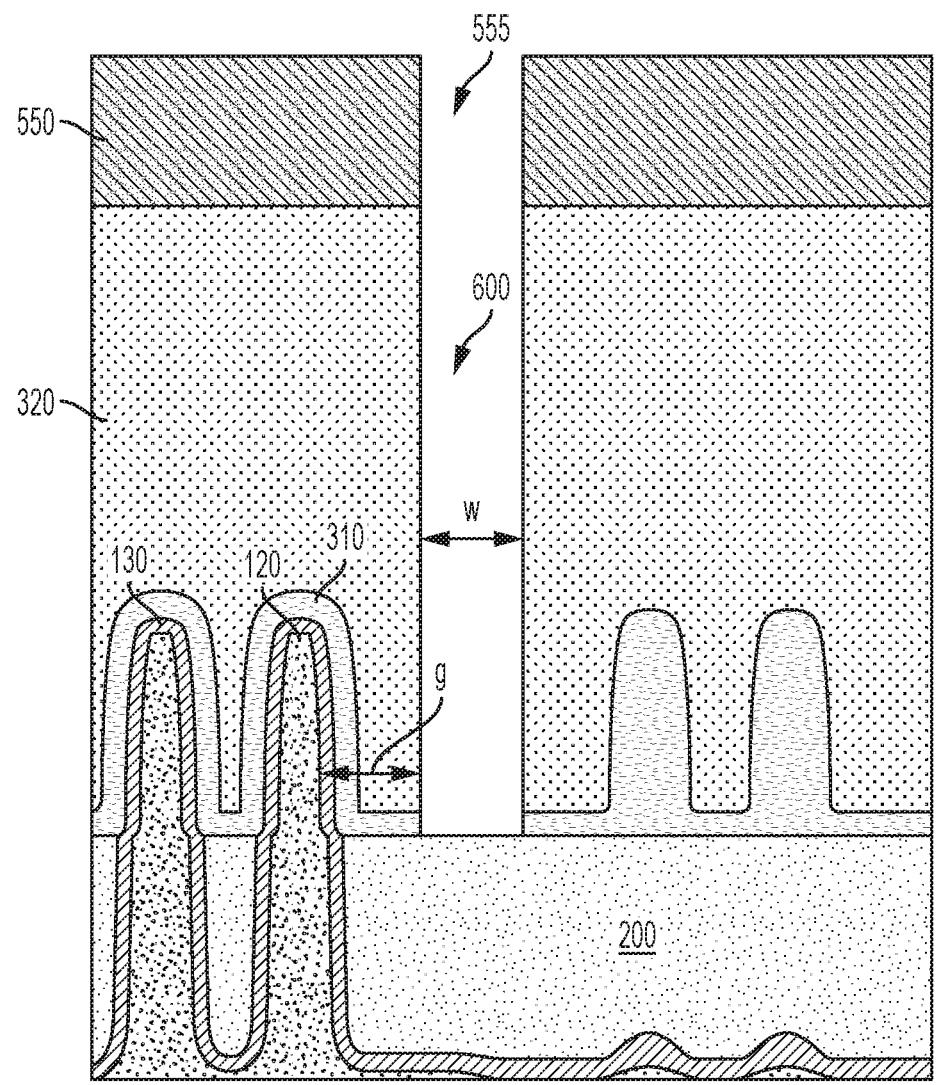

Referring to FIG. 8 and FIG. 8A, an opening 555 may be formed in hardmask 550 to expose a top surface of the sacrificial gate layer 320 within the opening 555. Thereafter, using hardmask 550 as an etch mask, a gate cut opening 600 is formed in the composite sacrificial gate 300 between a pair of adjacent fins. The opening 555 may be formed using conventional etching techniques.

In addition to the hardmask 550, patterning and etching to form the gate cut opening 600 may include forming a lithography stack (not shown) over the composite sacrificial gate 300, i.e., over hardmask 550. A lithography stack may include one or more of a photoresist layer, an etch stop layer, an amorphous carbon layer, an adhesion layer, an oxide layer, and a nitride layer. Such layers may be configured as known to those skilled in the art to provide a suitable masking layer to pattern and etch the underlying layer(s).

The etching process to form gate cut opening 600 is typically a selective, anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

A gate cut opening 600 may have areal dimensions (length and width) that independently range from 15 to 40 nm, although lesser and greater dimensions may be used. According to various embodiments, the areal dimensions of the gate cut opening through the sacrificial gate layer 320 are within lithography process windows for forming such structures, and enable the gate cut openings 600 to be defined with substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values. In certain embodiments, the width (w) of the gate cut opening 600 is less than 20 nm, e.g., 5, 10 or 15 nm. The gate cut opening 600 may have an aspect ratio of 4:1 or greater, e.g., 4:1, 5:1, 10:1, 20:1 or 40:1, including ranges between any of the foregoing ratios, where the aspect ratio is equal to the gate cut opening's depth divided by its width (w).

In various embodiments, a distance (g) between a sidewall of the gate cut opening 600 and an adjacent fin 120 may be less than 20 nm, e.g., 12, 14, 16 or 18 nm, including ranges between any of the foregoing values. Decreasing the distance (g) beneficially impacts the achievable density of devices. A gate cut opening 600 is configured to expose a portion of the STI layer 200 between adjacent fins without exposing the fins themselves.

Referring still to FIG. 8A, it will be appreciated that the sacrificial gate layer 320 is exposed along upper sidewalls of the gate cut opening 600, while the etch selective layer 310 is exposed along lower sidewalls of the gate cut opening 600, e.g., proximate to the bottom of the gate cut opening. In certain embodiments, shallow trench isolation layer 200 is exposed at the bottom of the gate cut opening 600.

Figure 9:
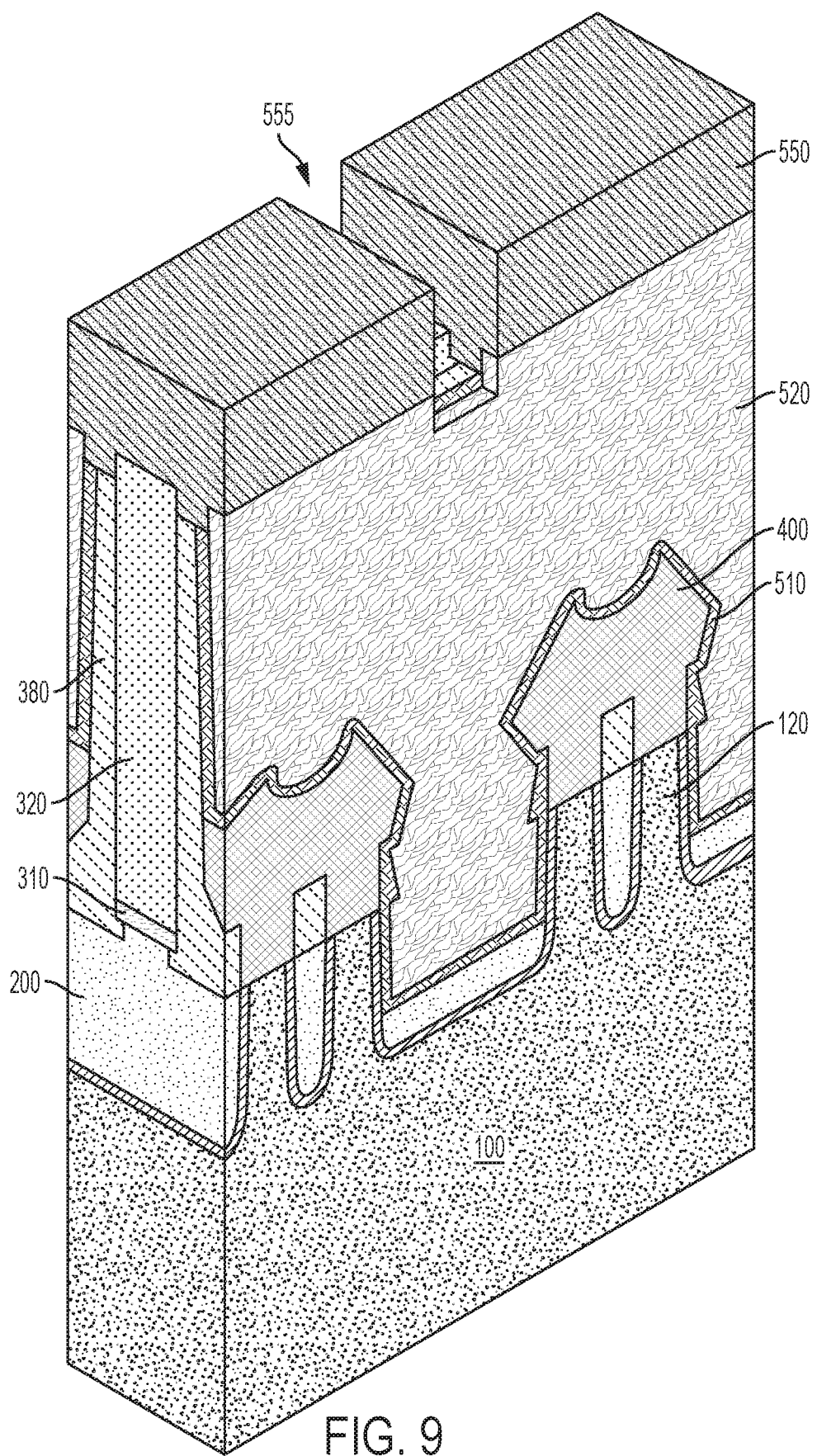
FIGS. 9 and 9A depict selective etching of the etch selective layer at the bottom of the gate cut opening.
Figure 9A:
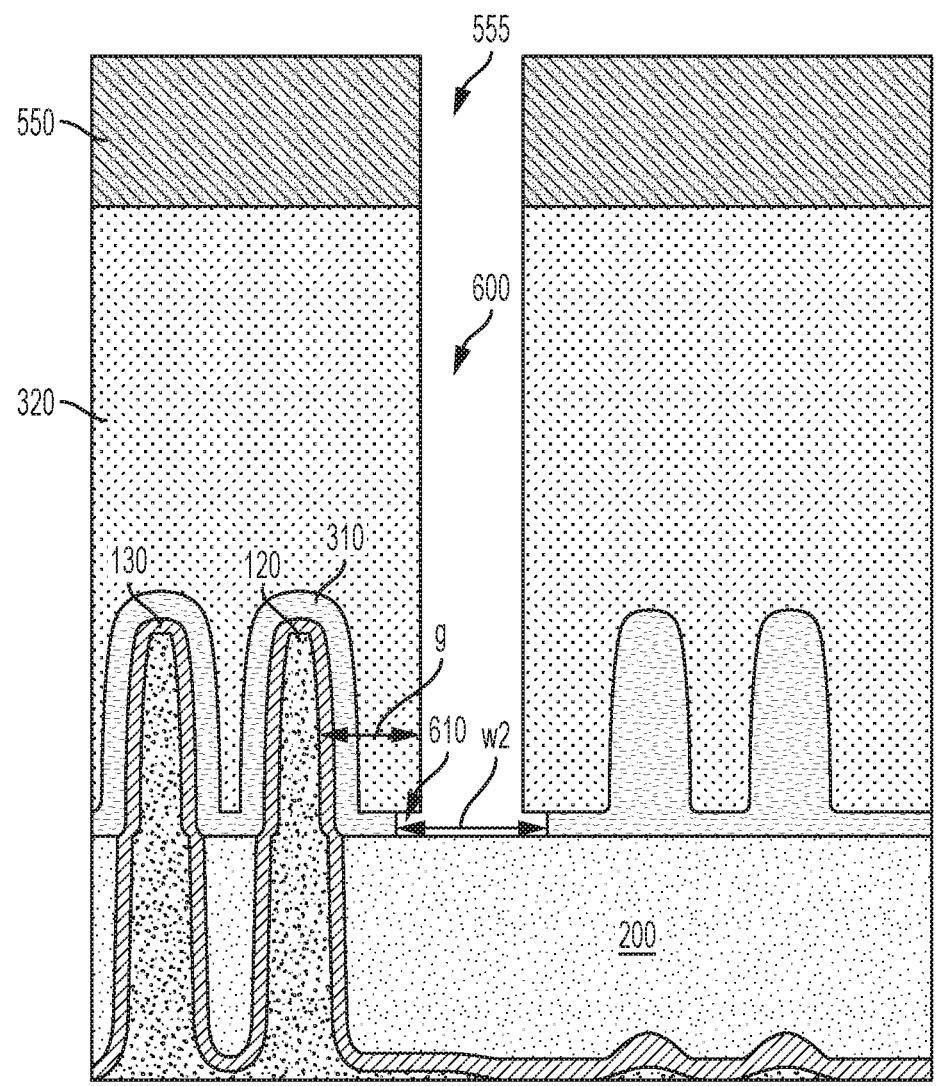

Referring to FIG. 9 and FIG. 9A, a further etch may be used to remove any remaining etch selective layer 310 from the bottom of the gate cut opening 600 and expose the shallow trench isolation layer 200. For example, in embodiments where the sacrificial gate layer 320 includes amorphous silicon and the etch selective layer 310 includes silicon germanium, a further selective etch is adapted to etch silicon germanium selectively with respect to amorphous silicon, which results in complete removal of the sacrificial gate layer 320 and the etch selective layer 310 from over STI 200 within the gate cut opening 600 without compromising, e.g., increasing, the gate cut opening CD.

Silicon germanium (SiGe) can be etched selectively with respect to silicon dioxide, silicon nitride and amorphous silicon, for example, using gas phase HCl or a wet etchant that includes hydrogen peroxide.

Thus, in certain embodiments, formation of the gate cut opening 600 includes at least a first etching step to selectively remove the sacrificial gate layer material, and a second etching step to selectively remove the etch selective layer material.

As seen with reference to FIG. 9A, during a second etching step, portions of the etch selective layer 310 may be removed from under the sacrificial gate layer 320 forming an undercut region 610. In certain embodiments, a lateral extent of the undercut region, i.e., the amount of the undercut, may range from 1 to 5 nm.

Figure 10:
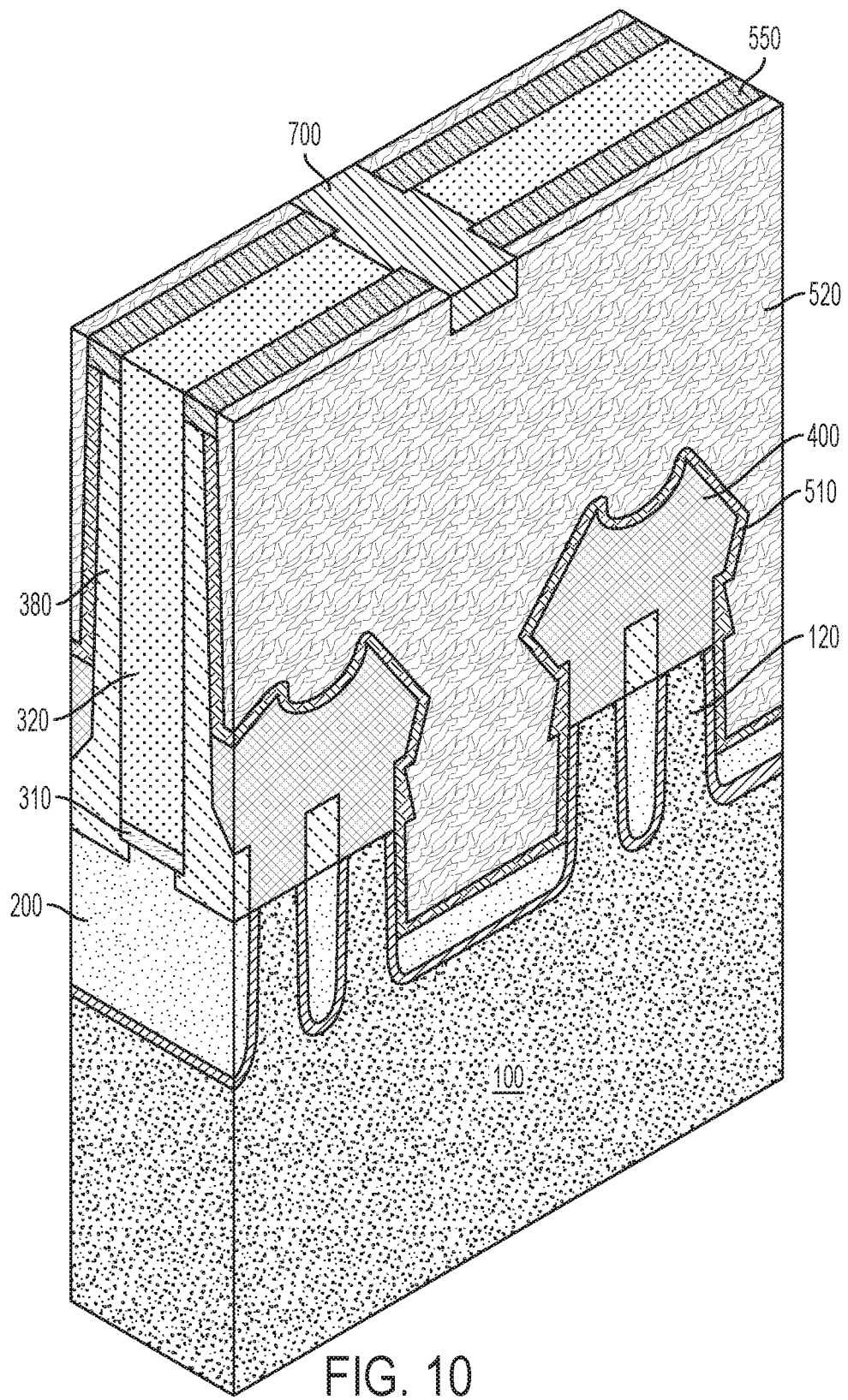
FIGS. 10 and 10A show the formation of an isolation dielectric layer within the gate cut opening.
Figure 10A:
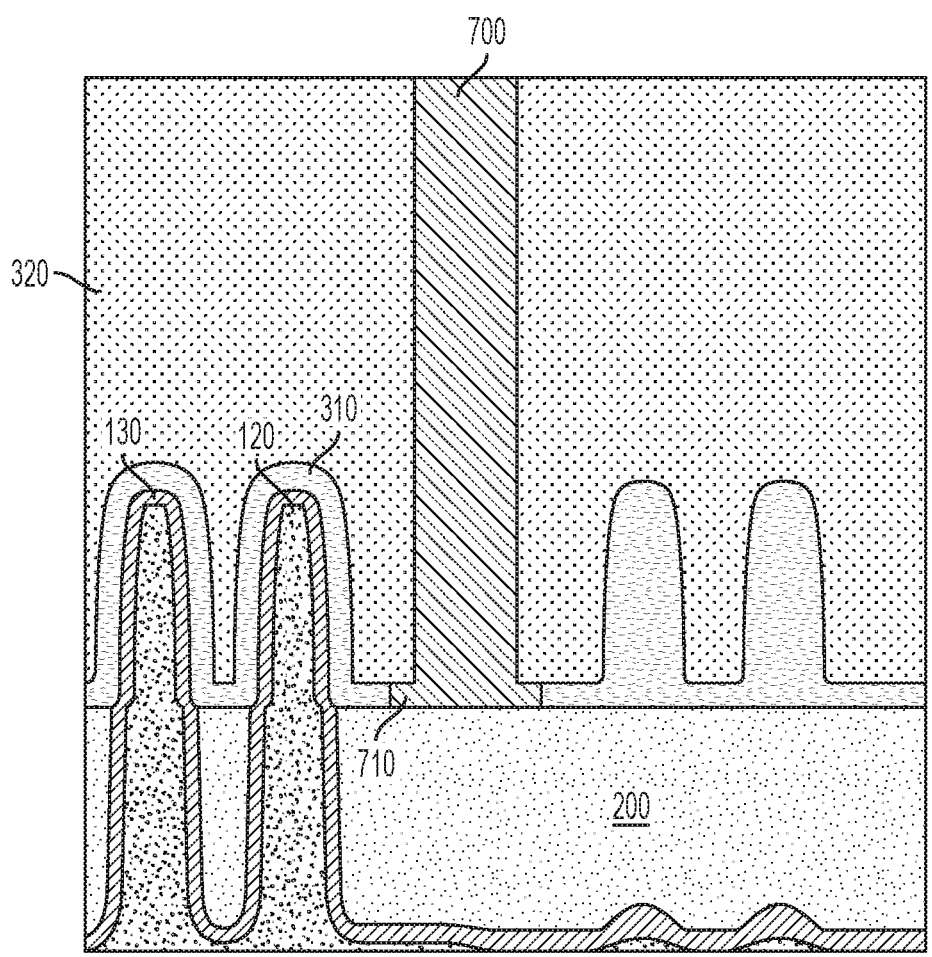

Referring to FIG. 10 and FIG. 10A, the gate cut opening 600, including undercut region 610, is backfilled with an isolation layer 700. A polishing step may be used to remove the overburden. The isolation layer 700 may include a dielectric material such as silicon nitride, SiCO, SiCN, SOCN, and the like, and may be formed by atomic layer deposition (ALD). According to various embodiments, the isolation layer 700 includes a material that enables the sacrificial gate layer 320 and the etch selective layer 310 to be etched selectively with respect to the isolation layer 700.

As will be appreciated, the gate cut openings 600 (including undercut region 610) are backfilled with isolation layer 700 in order to isolate adjacent sacrificial gate structures and hence isolate the later-formed functional gates associated with respective devices. Independent transistors may be connected by local interconnection methods and/or back end of the line metallization layers to form integrated circuits, such as SRAM devices.

Referring to FIG. 10A, in various embodiments, the isolation layer 700 has a first width (w) in an upper region thereof, and a second width (w2) greater than the first width (w) in a lower region thereof defining a laterally protruding portion 710, i.e., proximate to the STI layer 200, corresponding to the filled undercut region 610. In certain embodiments, the second width (w2) may be 2 to 10 nm greater than the first width (w), e.g., 2, 4, 6, 8 or 10 nm greater, including ranges between any of the foregoing values.

Figure 11:
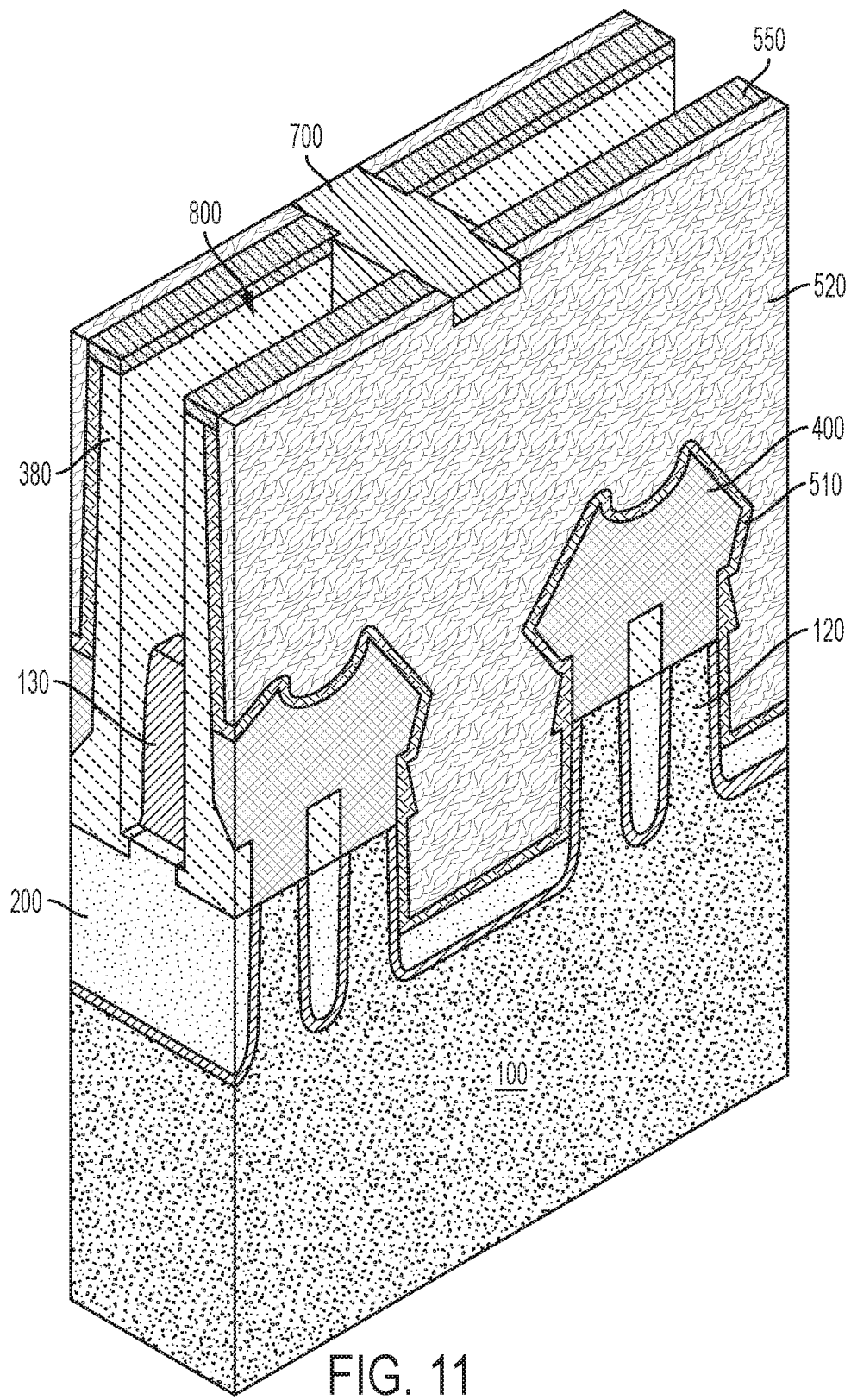
FIGS. 11 and 11A depict removal of remaining portions of the composite sacrificial gate from over channel regions of the fins.
Figure 11A:
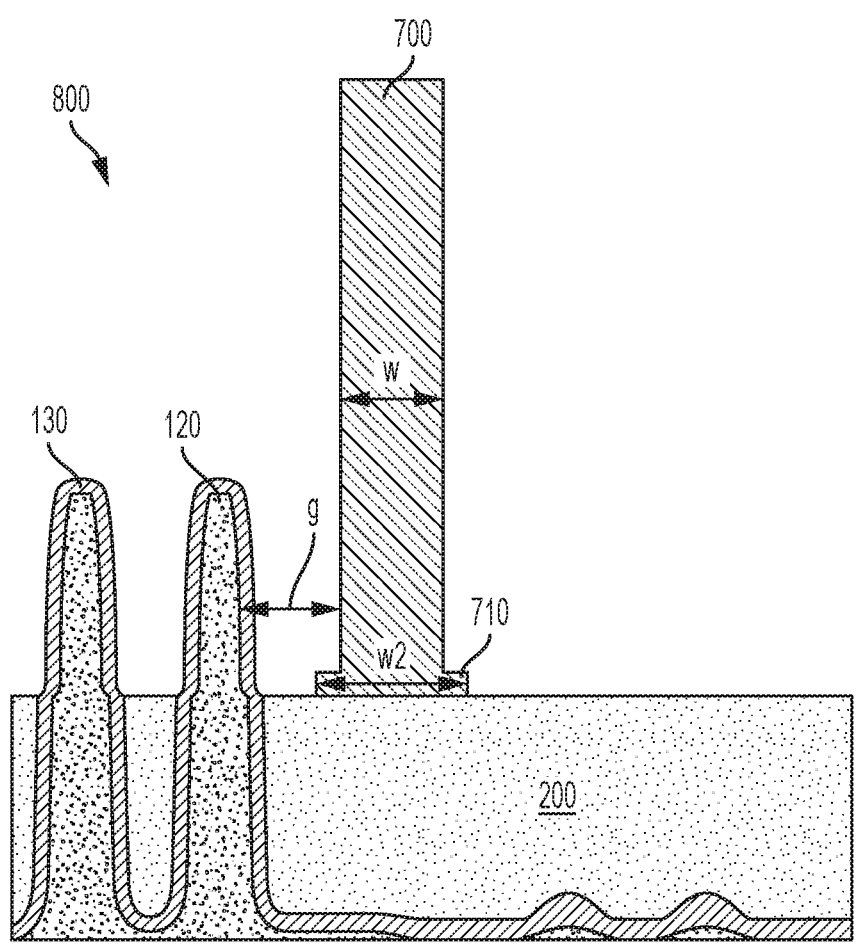

Referring to FIG. 11 and FIG. 11A, remaining portions of the composite sacrificial gate 300, including sacrificial gate layer 320 and etch selective layer 310 are removed to form gate contact openings 800 over channel regions of the fins, and a functional gate (not shown) may be formed within each opening 800. The functional gate includes a gate dielectric layer and an overlying gate conductor layer, as will be appreciated by those skilled in the art. In certain embodiments, a height of the isolation layer 700 is greater than a height of the functional gate.

In various embodiments, the EG oxide 130 is removed from over the channel regions of the fins 120 prior to forming the functional gate. For example, the EG oxide 130 can be etched using a buffered oxide etch, which can include a wet etching process or a vapor etching process that uses a buffered hydrofluoric acid (BHF) solution. By way of example, the BHF solution may include hydrofluoric acid (HF), ammonium fluoride ($NH_4F$) and water ($H_2O$). In a particular embodiment, the BHF solution contains 0.5 to 10 vol. % hydrofluoric acid, 30 to 50 vol. % ammonium fluoride, and 40 to 60 vol. % water. The BHF solution selectively etches the EG oxide 130 without etching the other layers of the structure.

In certain embodiments, the EG oxide 130 can be completely removed from over the fins and the accumulation of an EG oxide residue over the fins can be avoided. In such embodiments, because an increase in the width (w) of the gate cut opening 600 and hence a width of the isolation layer 700 is avoided, the gap (g) between a fin and the isolation layer 700 remains sufficiently wide to enable efficient removal of the EG oxide from over the fin without depositing a residue, which would adversely affect device performance.

According to various embodiments, a FinFET structure can be formed having a precisely controlled distance between the sidewall of an isolation layer and an adjacent fin without altering the design rules for the structure. The isolation layer is deposited within a gate cut opening, which is formed by selectively etching a composite sacrificial gate.

As described herein, the formation or deposition of a layer or structure, including the foregoing layers and structures, may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

As used herein, the singular forms "a," "an" and "the" include plural referents unless the context clearly dictates otherwise. Thus, for example, reference to a "gate cut opening" includes examples having two or more such "gate cut openings" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a fin that comprises silicon include embodiments where a fin consists essentially of silicon and embodiments where a fin consists of silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a structure, comprising:
   forming a composite sacrificial gate over a plurality of semiconductor fins, wherein forming the composite sacrificial gate comprises forming an etch selective layer over the fins and forming a sacrificial gate layer over the etch selective layer;
   forming a gate cut opening that extends through the composite sacrificial gate, wherein the gate cut opening is laterally spaced away from each of a pair of the fins, and forming the gate cut opening includes etching the etch-selective layer to form an undercut region that extends laterally beneath the sacrificial gate layer; and
   forming an isolation layer within the gate cut opening.

2. The method of claim 1, wherein the etch selective layer comprises silicon germanium or doped silicon and the sacrificial gate layer comprises amorphous silicon or polysilicon.

3. The method of claim 1, further comprising forming an extended gate oxide over the fins prior to forming the composite sacrificial gate.

4. The method of claim 1, wherein the gate cut opening extends entirely through the composite sacrificial gate.

5. The method of claim 1, wherein forming the gate cut opening comprises etching the sacrificial gate layer in a first etching step and etching the etch selective layer in a second etching step.

6. The method of claim 1, wherein the gate cut opening has substantially vertical sidewalls.

7. The method of claim 1, further comprising removing remaining portions of the composite sacrificial gate from over the fins to form gate contact openings, and forming a functional gate within the gate contact openings.

8. A method of forming a structure, comprising:
   forming an etch selective layer over a plurality of semiconductor fins and extending between the fins;
   forming a sacrificial gate layer over the etch selective layer;
   forming a gate cut opening that extends through the sacrificial gate layer and the etch selective layer, wherein the gate cut opening is laterally spaced away from the fins, and forming the gate cut opening includes etching the etch selective layer to form an undercut region that extends laterally beneath the sacrificial gate layer; and
   forming an isolation layer within the gate cut opening.

9. The method of claim 8, wherein the etch selective layer comprises silicon germanium or doped silicon and the sacrificial gate layer comprises amorphous silicon or polysilicon.

10. The method of claim 8, wherein forming the gate cut opening comprises etching the sacrificial gate layer in a first etching step and etching the etch selective layer in a second etching step.

11. A method of forming a structure, comprising:
    forming an extended gate oxide over a plurality of semiconductor fins;
    forming a composite sacrificial gate over a plurality of semiconductor fins after forming the extended gate oxide, wherein forming the composite sacrificial gate comprises forming an etch selective layer over the fins and forming a sacrificial gate layer over the etch selective layer;
    forming a gate cut opening by etching the etch selective layer to form an undercut region that extends laterally beneath the sacrificial gate layer and through the composite sacrificial gate, wherein the gate cut opening is laterally spaced away from each of a pair of the fins; and
    forming an isolation layer within the gate cut opening.

12. The method of claim 11, wherein the etch selective layer comprises silicon germanium or doped silicon and the sacrificial gate layer comprises amorphous silicon or polysilicon.

13. The method of claim 11, wherein the gate cut opening extends entirely through the composite sacrificial gate.

14. The method of claim 11, further comprising removing remaining portions of the composite sacrificial gate from over the fins to form gate contact openings, and forming a functional gate within the gate contact openings.

* * * * *